(12) United States Patent
Curatolo et al.

(10) Patent No.: US 8,415,276 B2
(45) Date of Patent: Apr. 9, 2013

(54) METHOD FOR OPERATING A SUPERCONDUCTOR AT A TEMPERATURE HIGHER THAN THE SUPERCONDUCTIVE TEMPERATURE $T_c$

(75) Inventors: Susana Curatolo, Lawrence, KS (US); Kai Wai Wong, Lawrence, KS (US)

(73) Assignee: CZT Inc., Lawrence, KS (US)

( * ) Notice: Subject to any disclaimer, the term of this patent is extended or adjusted under 35 U.S.C. 154(b) by 0 days.

(21) Appl. No.: 12/158,139

(22) PCT Filed: Dec. 26, 2006

(86) PCT No.: PCT/US2006/062600
§ 371 (c)(1),
(2), (4) Date: Jun. 19, 2008

(87) PCT Pub. No.: WO2008/013567
PCT Pub. Date: Jan. 31, 2008

(65) Prior Publication Data
US 2008/0293577 A1 Nov. 27, 2008

Related U.S. Application Data

(60) Provisional application No. 60/754,209, filed on Dec. 28, 2005, provisional application No. 60/806,825, filed on Jul. 10, 2006.

(51) Int. Cl.
*H01L 39/24* (2006.01)

(52) U.S. Cl. ............... 505/320; 505/182; 505/825
(58) Field of Classification Search ........... 505/320, 505/182, 825
See application file for complete search history.

(56) References Cited

U.S. PATENT DOCUMENTS 5,462,916 A 10/1995 Masumi et al.

OTHER PUBLICATIONS

STIC search string Jun. 28, 2011.*
Hoffman et al., "Persistent photoinduced superconductivity," Journal of Alloys and Compounds. Vlo. 251, Issues 1-2, pp. 87-93, Apr. 1997.

* cited by examiner

*Primary Examiner* — Paul Wartalowicz

(57) ABSTRACT

A method of operating a superconductor in its superconductivity state at a temperature Tc(i) in the range of $T_c^*$ to $T_c$, where $T_c^*$ is greater than the superconductivity temperature $T_c$ of the superconductor, includes cooling the superconductor to a temperature of $T_c$ or less and applying energy to the superconductor after the superconductor has entered a superconducting state. The energy corresponds to the quantum energy hv in the range of a minimum energy less than $E_0$ to less than $E_0$, where $E_0$ is the ground state of the two-dimensional excitation binding energy of the superconductor The superconductor is then cooled to the selected temperature $T_c(i)$. The minimum energy is 8/9 of $E_0$.

8 Claims, 5 Drawing Sheets

METHOD FOR OPERATING A SUPERCONDUCTOR AT A TEMPERATURE HIGHER THAN THE SUPERCONDUCTIVE TEMPERATURE $T_c$

CROSS-REFERENCE TO RELATED APPLICATIONS

This application is a National Phase Application based upon and claiming the benefit of priority to PCT/US2006/62600, filed on Dec. 26, 2006, which is based upon and claiming the benefit of priority to Provisional U.S. Patent Application Ser. No. 60/754,209, filed Dec. 28, 2005, and Provisional U.S. Patent Application Ser. No. 60/806,825, which was filed Jul. 10, 2006, the contents of all three of which are incorporated herein by reference.

BACKGROUND AND SUMMARY OF THE DISCLOSURE

The present disclosure is directed generally to superconductors and more specifically to a method and apparatus for tuning the superconductivity temperature $T_c$ of a superconductor to a temperature greater than $T_c$.

The method of operating a superconductor in its superconductivity state at a temperature $T_c(i)$ in the range of $T_c^*$ to $T_c$, where $T_c^*$ is greater than the superconductivity temperature $T_c$ of the superconductor, includes cooling the superconductor to a temperature of $T_c$ or less and applying energy to the superconductor after the superconductor has entered a superconducting state. The energy corresponds to the quantum energy hv in the range of a minimum energy less than $E_0$ to less than $E_0$, where $E_0$ is the ground state of the two-dimensional excitation binding energy of the superconductor. The superconductor is then cooled to the selected temperature $T_c(i)$. The minimum energy is 8/9 of $E_0$.

The energy is applied by a light source, which may be pulsed. The superconductor is cooled at the temperature of $T_c$ or less until the temperature of the superconductor falls below the cooling temperature. The superconductor is cooled at the temperature of $T_c$ or less until a sufficient amount of stable global localized excitons are produced to sustain superconductivity.

The energy may be applied before the cooling temperature is raised above $T_c$ or after the cooling temperature is raised above $T_c$ and before loss of the superconducting state. The energy $E_0$ is a function of the fraction of whole density n which varies with variations in the superconductor material.

These and other aspects of the present disclosure will become apparent from the following detailed description of the disclosure, when considered in conjunction with accompanying drawings.

DETAILED DESCRIPTION OF THE PREFERRED EMBODIMENTS

Since the discovery of High Temperature Cuprate Superconductors [2], it has been found that the superconducting $T_c$ value is correlated to the number of $CuO_2$ layers in its crystal structure, with a maximum reached at 3 layers. In addition to this feature, $T_c$ varies according with whole carrier density in an inverse parabolic form. Apart of $T_c$, the Excitonic Enhancement Mechanism (EEM) model also predicts other novel properties in both the normal and superconducting phases, such as the sign changes that were observed in the mixed-state quantum Hall effect [3], and the thermal electric power [4].

The EEM theory is based essentially on the dipolar interband interaction between an intrinsic partially filled valence 'p' band VB from the Oxygen ions and the empty conduction 's' band CB of the Ba/Sr ions, which lay above the $CuO_2$ layer. Because of this interband interaction, a significant renormalization of the intrinsic electronic band structure is produced, and excitonic levels are introduced inside the band gap G. In fact, excitonic levels within the band gap occur in $CuO_2$ crystal as well [5].

Figure 1:
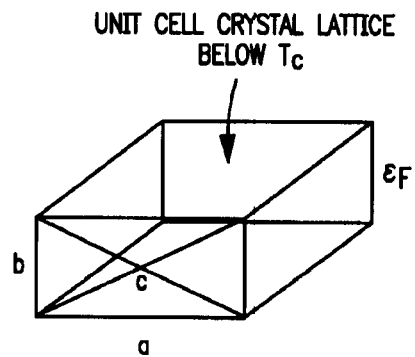
FIG. 1 is a perspective view of a unit cell crystal lattice below the conductivity temperature $T_c$.
Figure 2:
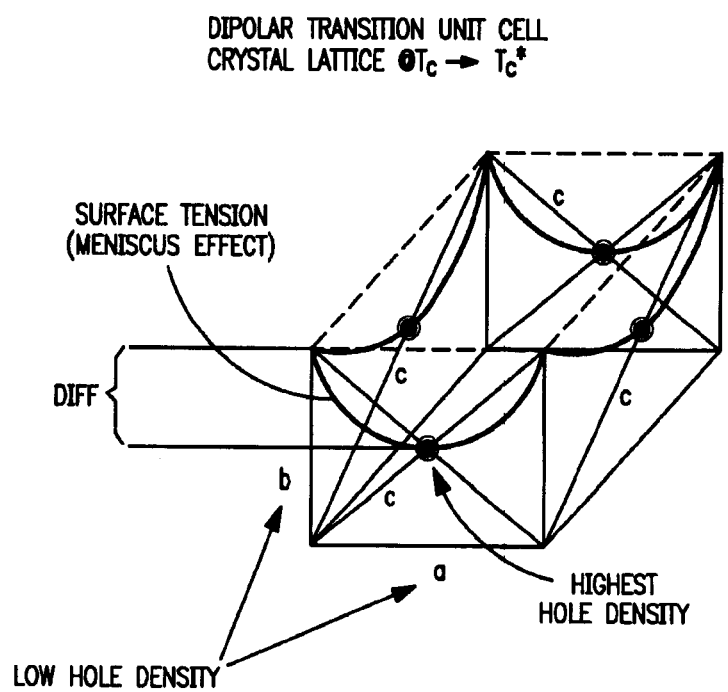
FIG. 2 is a perspective view of a unit cell crystal lattice as $T_c$ approaches $T_c^*$ during bipolar transition.
Figure 3:
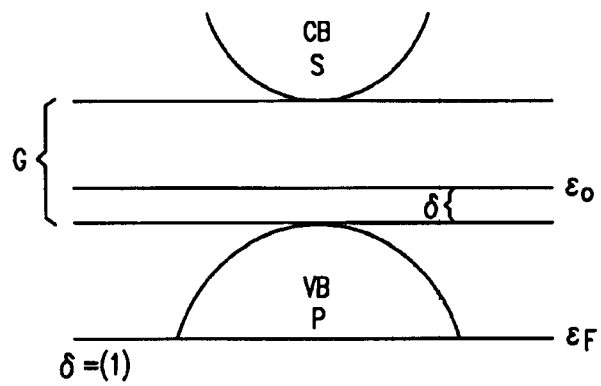
FIG. 3 is a BG diagram of the current density of the holes in the conduction band and the electrons in the valence band for a superconductor below $T_c$.

In the HTS Cuprates, according to EEM, the excitonic ground level $\in_0$ lies just above the valence band VB, while the renormalized hole band is strongly space dependent [1], as shown in FIG. 3. Due to this feature, it was found that much of the occupied 'p' electrons in VB are located along the a,b axes of the unit cell, separated from the excitonic ground level by G* inside the band gap G. As G* is of order 100K, these 'p' electrons are thermally excitable into this G* level. Should this occur, global localized excitons having binding energy exceeding thermal fluctuation are formed. These Bosonic excitons can now be employed as exchanged particles by the mobile holes to form Cooper pairs, similar to the phonons mechanism in the low temperature Superconductors. Since excitons have excited levels similar to phonons and a large enough population of such excited excitons is maintained stable, $T_c$ can be enhanced.

Figure 4:
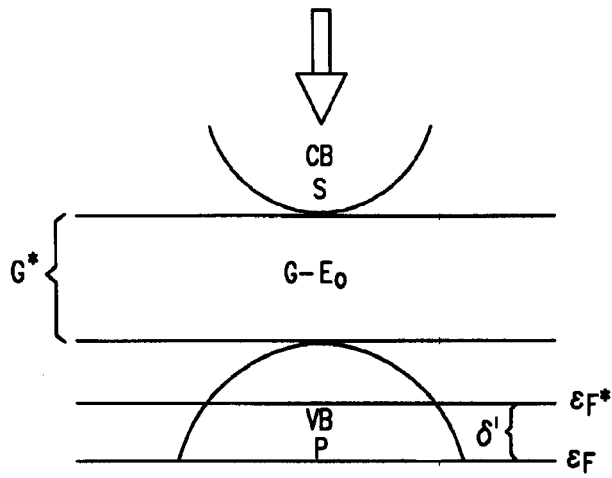
FIG. 4 is a BG diagram of a superconductor at $T_c$.

The renormalized band of energy spectrum $\lambda_2$ is given by $$\lambda_2 = \in^*_F - \in_a - \Delta_{ps} \qquad (1)$$

where $\in_a$ is the hole kinetic energy, and $\in^*_F$ is the renormalized Fermi-energy, which cuts through VB, as shown in FIG. 4.

$$\varepsilon_F^* = \varepsilon_F - \frac{\Delta_{dip}^2}{\varepsilon_F + G^*} \qquad (2)$$

$\Delta_{dip}$ is the space dependent dipolar transition matrix [see eq. (3.35) in ref. [1], for detail], and G* the renormalized band gap $$G^* = G - E_o \qquad (3)$$

The quantity $E_o$ is the ground state of the two-dimensional exciton binding energy, hence $$E_o = \frac{16Rm^*}{\varepsilon^2} n^2 \qquad (4)$$

where R is the Rydberg constant, $\in$ is the interband dielectric constant, m* the effective reduced mass and 'n' the fraction of 'p' hole density. The fraction of whole density n which varies with variations in the superconductor material. For example, variations in the amount of oxygen in a cuprate changes the energy $E_o$. Obviously, the two dimensional exciton has excited energy levels within the renormalized band gap. These levels are given by $$G_m^* = G - E_m \qquad (5)$$

where $$E_m = \frac{E_o}{(2m+1)^2}, m = 1, 2, \ldots \qquad (6)$$

These higher levels are of order eV above VB, and are not reachable by thermal excitation.

Finally the pseudo-gap $\Delta_{ps}$ [see eq. (3.40) in ref. [1]] is positive, but vanishes on $\in^*_F$. The space dependent form for $\Delta_{dip}$ [see eq. (3.37) in ref. [1]]

$$\Delta_{dip}^2 = \Delta_{(0)}^2 [1 - \sin 2\phi] = \Delta_{(0)}^2 \frac{\pi - 2}{\pi} \qquad (7)$$

where ø is the angle measured from the a-axis of the cell in the a-b plane. It is clear that the renormalized hole Fermi energy $\in^*_F$ as shown in eq. (2), varies from a maximum of $\in_F$ to a minimum of $$\varepsilon_F - \frac{\Delta_{(0)}^2}{\varepsilon_{F+G^*}}$$

along the a,b axes. In other words, the hole density is largest along the cell diagonals, and smallest along the a,b axes, resembling a liquid with surface tension being placed in a rectangular container, with the container walls given by the ac, and bc surfaces. Such a fluid will have a fluid surface lowest at the center of the a,b cross-section, and highest on the walls. The difference between the lowest and highest surface points is determined by the surface tension. If the height of the container walls, as measured from the lowest fluid surface level, is less than the necessary difference due to the surface tension, then fluid will creep over the walls, until a new equilibrium level is reached.

For the 'p' electrons in VB, it is therefore those long the a,b axes that are first excited into the excitonic ground level G*, provided the system temperature T is of order G*. However, the thermal excitation of the electrons into G*, does not mean that stable excitons are formed. The excitons are stable if and only if, its binding energy exceeds the thermal fluctuation energy which creates them in the first place. Should this condition be satisfied, global formation of localized excitons will occur in the structure, quite similar to the phonon lattice. Because excitons are Bosons, when coupled to the mobile holes they can replace phonons, and lead to hole-hole Cooper pairing, thus producing superconductivity.

To obtain $T_c$ based on exchange of excitons, the exciton's excitation energy [see eq. (3.15) in ref. [1]] is given by $\lambda_3$ minus the exciton binding energy to the lattice.

$$\hbar\Omega = \lambda_3 - \frac{2\Delta_{dip}^2}{\varepsilon_F + G^*} \qquad (8)$$

where $$\lambda_3 = G^* + \varepsilon_F^* + \frac{2\Delta_{dip}^2}{\varepsilon_F + G^*} \qquad (9)$$

Note, this excitonic binding to the lattice vanishes along the a,b axes. The space average value of which is of the order of eV, and is quite stable in the superconducting phase. Hence the lateral thermal fluctuation that destabilizes the bound exciton occurs in the normal phase. Because the excitonic levels of the system are inside the band gap, it implies such exciton is localized or bounded to the crystal lattice. Hence, when the exciton is delocalized, it will decompose into a free electron and a free hole. Such a picture for the normal phase gives raise to the two carriers model [6].

This bound excitonic excitation energy $\hbar\Omega$ now replaces the Debye phonon energy in the Cooper pair BCS energy gap $$\Delta_{BCS} = 2\hbar\Omega \exp\left(-\frac{1}{JN_F^*}\right) \qquad (10)$$

where J is the coupling strength and $N^*_F$ is the hole Fermi-surface density.

Since the superconducting $T_c$ is directly proportional to the BCS gap $\Delta_{BCS}$, it follows for the Cuprate, $T_c$ is the proportional to the exciton excitation energy. It is precisely this feature that allows EEM to explain the $T_c$ dependence on the whole density [see ref [1] for more detail]. When the excitons are excited to its first excitation level optically, then it follows that $\Delta_{BCS}$ will also be enhanced, as $\hbar\Omega$ is replaced by $$\hbar\Omega_1 = G^*(1) + E^*_F(1) \qquad (11)$$

The minimum photo-excitation necessary to excite the excitons into the first excited level is:

$$h\gamma_1 = \frac{8}{9} E_o \qquad (12)$$

Figure 5:
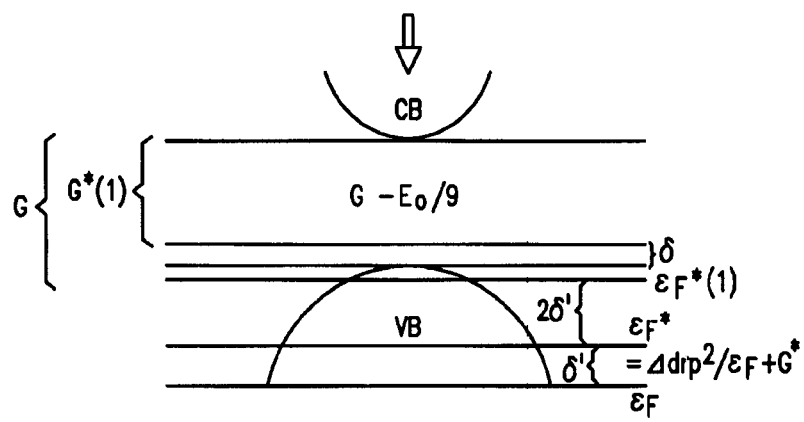
FIG. 5 is a BG graph of the superconductor at a temperature above $T_c$.

As $h\nu_1$ is of order 1 eV, it follows the photon wave-length is much larger than the crystal cell dimensions. Hence when the system is pumped with such infrared photons, the populated electrons with the highest energy level are excited. There is a difference where these electrons are located depending on the system's physical phase. Suppose the temperature T of the system is below $T_c$, which means stable ground state excitons are already formed, then it follows that the photon must directly excite the excitons into the level G*(1), as shown in FIG. 5.

$$G^*(1) = G - \frac{E_o}{9} \qquad (13)$$

This in turn changes the renormalized Fermi energy to $$E_F^*(1) = \varepsilon_F - \frac{\Delta_{dip}^2}{\varepsilon_F + G^*(1)} \quad (14)$$

Following the discussion earlier on the proportionality of $T_c$ on the exchange exciton excitation energy $\hbar\Omega_1$ and assuming J and $N^*_F$ remain relatively constant, the enhancement of $T_c$ to $T_c^*$ can be estimated from the ratio $$\frac{T_c^*}{T_c} \cong \frac{\hbar\Omega_1}{\hbar\Omega} \quad (15)$$

Figure 6:
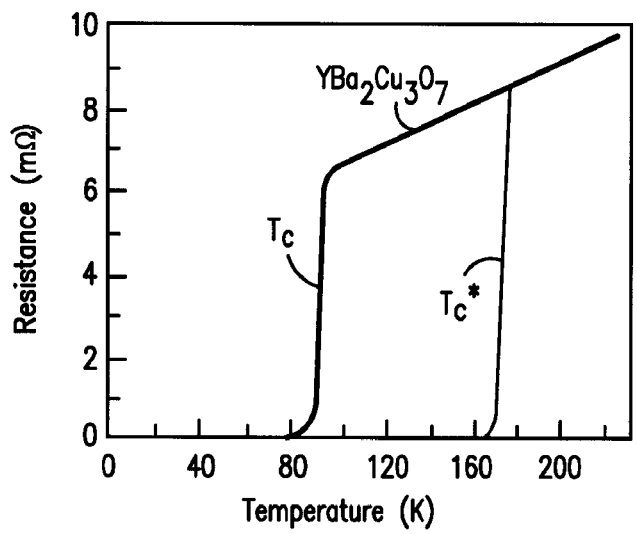
FIG. 6 is a graph of resistance versus temperature for $YBa_2Cu_3O_7$ at $T_c$ and $T_c^*$.

For $YBa_2Cu_3O_7$, $T_c$=93K, the experiments discussed below have obtain $T^*_c$ of at least 170K, which is a large increase. The graph is shown in FIG. 6.

For the system temperature T above $T_c$, which means it is in the normal phase, no stable excitons are formed. In order to populate the exciton G*(1) level, the 'p' electrons must be directly excited on the a,b axes to this level. The photon energy needed for this direct excitation is $$\hbar\Omega_1^* = \frac{8}{9}E_o + G^* = \hbar\Omega_1 \quad (16)$$

The extra thermal energy G* represents the energy for formation of an exciton crystal lattice below $T_c$. This excitonic crystal lattice must occur before the transition into the superconductivity phase. In fact, a specific heat measurement should reveal such a lattice phase transition slightly above $T_c$. Therefore in obtaining the optical pumped $T_c^*$, we must also have a global exciton formation in the system to cause Cooper pairing of the mobile holes. Hence, it is vital that enough photons are uniformly absorbed over the entire surface of the HTS material so that $T_c^*$ be realized.

Normally this excited excitonic state bound to the lattice is unstable, but the population can be maintained through continuous optical pumping. Thus the exchange of this excited exciton by the mobile holes can again form and or maintain Cooper pairs, leading to the maintaining of the superconducting phase or state if T is below $T_c^*$.

Lastly, let us investigate the equilibrium excited exciton population through optical pumping. Suppose N(0) is the maximum allowed number density of excitons in the system. Let N(t) be the number density of excited excitons at time t.

$$\frac{dN}{dt} = \alpha_I(N(o) - N) - \beta N \quad (17)$$

Then where $\alpha_I$ is the optical intensity dependent excitation rate, and $\beta$ is the natural relaxation rate of the excited state:

$$N(t) = \frac{\alpha_I}{\alpha_I + \beta}N(o)[1 - e^{-(\alpha_I + \beta)t}] \quad (18)$$

Since $\alpha_I$ increases with the optical intensity, while $\beta$ is the intensity independent relaxation rate, the sharpness of the superconducting transition $T_c^*$ must then be adjustable through increasing the beam intensity. Note, that the beam also causes thermal heating of the whole system. If the heating rate exceeds the thermal cooling rate to the outside thermal bath, then such a superconducting phase cannot be stable. Although, in principle through optical exciton, superconductivity at temperatures $T_c^*$ should be obtainable. However, because of the thermal equilibrium of the system with its surrounding thermal bath, an enhancement superconducting system may operate at temperatures a bit below $T_c^*$. The exact temperature is light intensity dependent. Technically, it is more effective to create such a $T_c^*$ superconductor by enclosing the superconducting sample inside an optical fiber, and by shining the laser through the optical fiber, thus eliminating photon losses.

As exciton can be excited, it can also be destroyed. To destroy the exciton, the superconductor is irradiate with photon of energy at least equal to $E_o$. For the YBCO system, $E_0$ is approximately 1 eV. The reported values vary from 1 eV to 1.09 eV. When the exciton absorbed such a photon and before the superconducting gap is destroyed, its excitation energy becomes $$\hbar\Omega = G + \varepsilon_F - \frac{\Delta_{dip}^2}{\varepsilon_F + G^*} \quad (19)$$

This exciton has a maximum energy value along the ab cell diagonals equal to $G+\varepsilon_F$. For YBCO, the value is equal to 3 eV. Thus, the Cooper pair energy gap to produce photoemission is 6 eV, along the basal cell diagonal, as reported by several authors, see reference [7] for detail. Such photo-emission along the basal cell diagonals does not imply that the Cooper pair charges travel only along the diagonals as suggested. What is not reported in those works is the photo-absorption of a photon of 1 eV or $E_0$ which has occurred first.

Experiments were performed on off-the-shelf inexpensive YBCO to show the extension of $T_c$. At least one of the necessary wavelength boundaries to induce the enhanced superconductive temperature $T_c^*$, as stated by equation 12, is $8/9E_0$. For an $E_0$=1.07 eV, 8/9 of 1159 nanometer wavelength corresponding to 1300 nanometers for $E_0$. Thus, the experiment was carried out using an inferred source having a wavelength in the 1300 nanometers to 1160 nanometers range. Depending on the accuracy of the source, the higher energy range or shorter length would be moved to 1200 nanometers for example. The range for BISCO and thallium-based high temperature superconductors will vary based on their respective $E_0$.

Although $8/9$ $E_0$, which produces and endless repeating number, was used in the above example to tune $T_c$, other levels of energy less than $E_0$ will also produce enhanced $T_c^*$ as will be discussed below.

First Experiment

Figure 7:
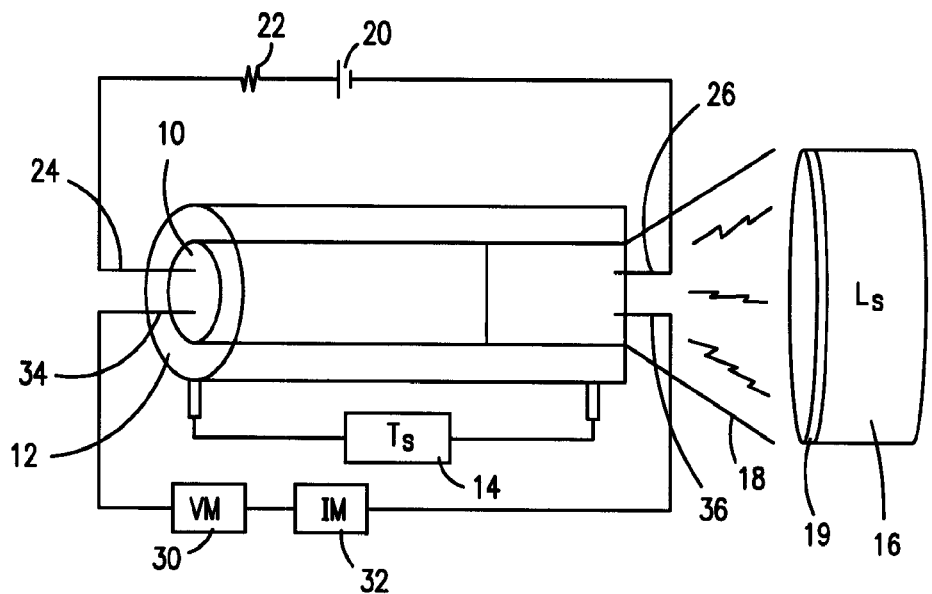
FIG. 7 is an apparatus used for the first experiment.

One specific structure of the experimentation is illustrated in FIG. 7. A superconductivity material YBCO was provided in the inner chamber of a housing 12. A temperature source 14 is connected to the housing 12 between the two cylinders. A temperature modifying source 14 was liquid nitrogen. A light source 16, for example an inferred light source, is coupled to the housing by a funnel 18 which directs the light into the edge of the superconductor 10. A battery 20 and resistor 22 is connected by conductors 24 and 26 to the superconductive material 10. The measurement circuit which includes voltage meter 30 and current meter 32 which are also connected to the superconductive material 10 by conductors 34 and 36. The conductors are copper/gold wires for the appropriate millivolt and microampere measurements. This is an open cryogenic chamber.

The processes for the first experiment are as follows:

Step 1: At room temperature, apply approximately 0.1 milliamp current. A finite voltage should be measured. Next, the temperature source 14 holds the superconductor to the temperature of liquid nitrogen. Again a 0.1 microampere current is applied and the voltage measured should be zero.

Step 2: Modified temperature source 14 to raise the temperature by allowing the liquid nitrogen to evaporate. At the superconductivity temperature $T_c$, the voltage should jump up as shown in the graph of FIG. 6 at $T_c$.

Step 3: Apply the light source 16 at the selective wavelength which corresponds to the 8/9 $E_0$. Repeat the step of taking the liquid nitrogen below $T_c$ and allowing temperature to rise. Observe and measure the voltage from $T_c$ to the enhanced superconductive temperature $T_c^*$.

For YBCO, the original $T_c$ should be and was 93° K. and the observed $T_c^*$ was 170° K. The ability operate a superconductor in its superconductivity state between $T_c$ and $T_c^*$ results from applying a wavelength corresponding to the energy needed for the selected superconductivity material.

The additional experiments were conducted for the measurement of EEM. The superconducting material used in both setups was YBCO tablet, 25 mm in diameter and 3 mm thick. The light source hand a wave length of 1300±50 nanometers and was spaced 25 mm from the material to provide the appropriate intensity.

Second Experiment

Set up Floating Magnet: A 5 mm cube magnet was suspend as a pendulum above the YBCO tablet at approximately 2 mm distance. The cryostat consisted of two nested glass jars holding the liquid nitrogen between them. A type T thermocouple was used to measure the temperature in the inner jar containing the YBCO. All temperature data was measured by Fluke RMS 187 in Celsius. All visual data of the Meissner effect throughout the temperature range was recorded with SONY handycam video camera. A second camera was used to record the cryostat environment on TV and Fluke measurements simultaneously. This created a complete video record of the experiment. The IR source is LED (incoherent light) set up as described in the first experiment. This light source is applied to the point where the Meissner effect is lost.

Floating Magnet Results: We start at room temp and magnet pendulum is centered on tablet. $T_c$ is obtained and then lost at before 155.78K.

When the IR is applied to the YBCO at 155.78K, it reacts in the following manner. The pendulum moves off-center to the right at $T_c^*$ONSET=156.98K. It progresses to Meissner effect through $T_c^*½$ way=165.78K and reaches $T_c^*$ at 172.48K at Meissner. But full Meissner is at about 178K when the magnet is completely off the tablet to the side wall. There is a 10-12° K. difference in temperature with the RT value during cool down to $T_c$, and this is due to the thermocouple not being on the tablet itself but on the jar bottom. Once the jar bottom and the tablet come to be close in temperature nearing $T_c$, the difference is 2 to 3° K only. This $T_c^*$ value seems to indicate the first large enough exciton population causing an enhanced $T_c$ and zero susceptibility. The lights came off at 177.58K. The magnet stays in Meissner position (floating) until $T_c^*$=185.5K. This value is close to $T_c^*2$. It is worth noting that the Floating Magnet temperatures while in Meissner also oscillate between values 188.4K (T*2 in RT) and 183.3K (T*1 in RT) correlating to the oscillations observed in the RT experiment which are the exciton (hydrogen) spectrum.

Third Experiment

Setup 3 for resistance verses temperature RT consisted of the 25 mm YBCO tablet with 4 point probe soldered onto its surface. The two outer wires are for current applied of 0.5 A. The two inner wires are for measurement of voltage drop. A middle wire is the thermocouple as shown in FIG. 7. The power source was current limited and the initial voltage drop at room temperature was 2 to 3 mV. The voltage was measure by Agilent micro-voltmeter 34420A. The IR source is LED set up as in the previous experiments, which was applied to the point where the Meissner effect is lost.

RT Results. When IR is applied to the YBCO tablet at 155.78K, it reacts in the following manner. Large oscillations are induced and level off at near T*1 with susceptibility value of 2. This is followed by further oscillations leading to $T_c^*1$ at 178.58K and zero susceptibility. This seems to indicate the first large enough exciton population causing an enhanced $T_c$ and zero susceptibility. This first $T_c^*1$ is followed again by dampened oscillation leading to a second terrace T*2 with susceptibility value of 1.75, which is at a lower susceptibility than T*1 but higher than $T_c^*1$. T*2 is followed by a monotonic decline to a second $T_c^*2$ value at 185.58K with a zero susceptibility. Again this seems to indicate the second large enough exciton population causing a second enhanced $T_c$ and zero susceptibility. Immediately after, the decline continues but then again a brief period of rapid oscillations followed by a dampened decline ending in a further reduced T*3 having a susceptibility terrace of 1.5. This third terrace T*3 is lower susceptibility than the susceptibility of the second terrace T*2 and much lower susceptibility than the susceptibility of T*1.

Figure 8:
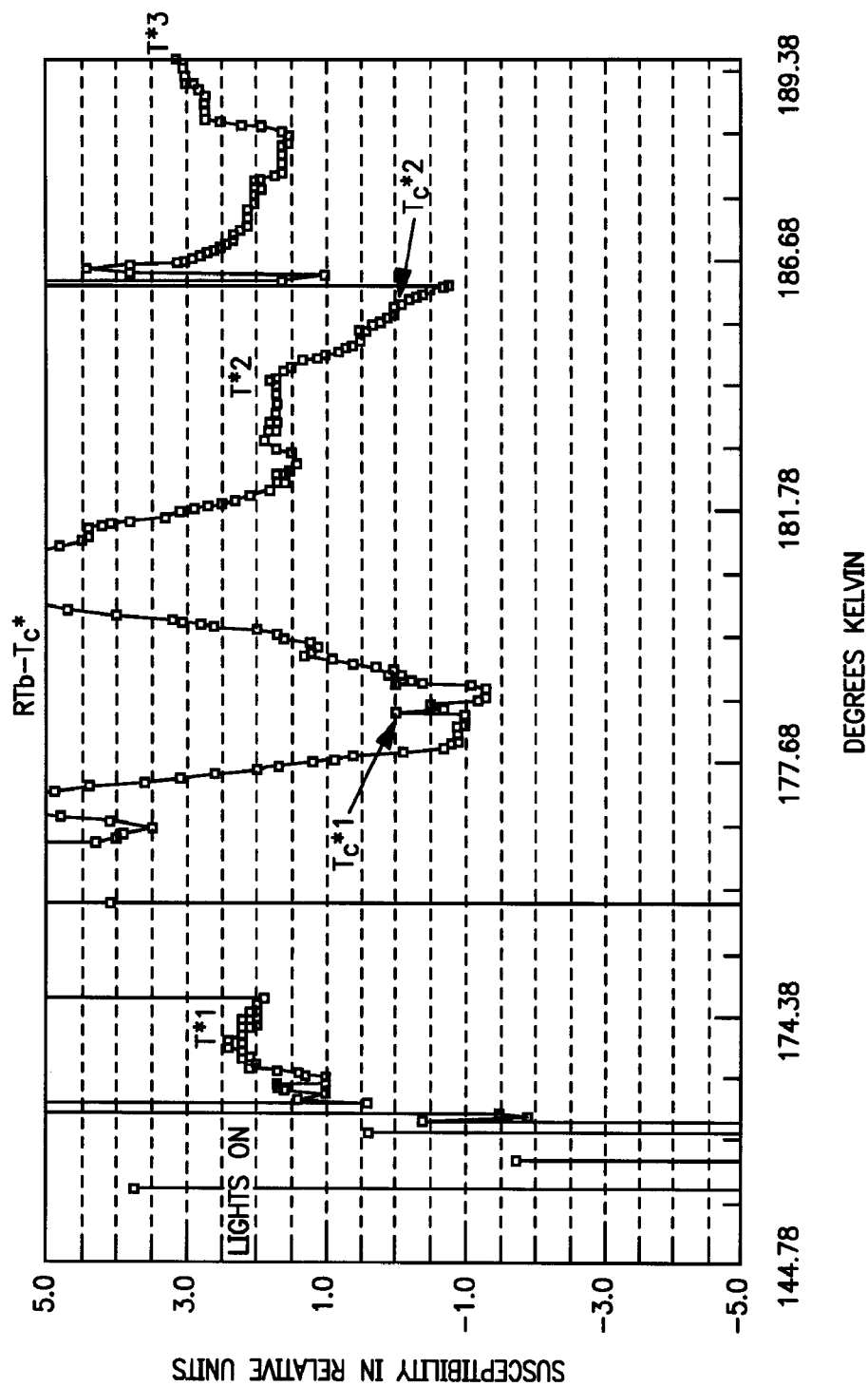
FIG. 8 is a graph of susceptibility versus temperature for the third experiment of YBCO.

These results are clearly shown in FIG. 8. The larger oscillations when the light is applied before T*1 and when the light is removed at T*3 is a typical reaction of the single phase material. Also, the fluctuations between $T_c^*1$ and T*3 are small, but appear large in FIG. 8 because of the scale.

At about 189.38K, the IR light source is removed, which is 12° warmer than in the floating magnet experiment 2. These results are supported by the results from the separate Floating Magnet experiment which makes use of a pendulum type floating magnet.

Discussion of Results of Experiments 2 and 3

Starting IP pumping at T>$T_c$, we have observed and demonstrated that excitons can be excited. Thus, with IR photon energy 8/9 $E_0$<hv<$E_0$, the first excited state is steadily filled. When the global population N exceeds a certain value, they induce cooper pairing of holes. This leads to superconductivity as long as T<$T_c^*1$, with $T_c^*1$ of 175 K. Within this temperature range (T) we see R=0 (susceptibility) and the Meissner effect. When the temperature T exceeds $T_c^*1$, cooper pairs are broken and excitons are decorrelated, thus again subject to IR excitations.

With 24/25 $E_0$<hv<$E_0$, we now populate the second excitation level. This in turn leads to a superconducting phase with $T_c^*2$~183K, etc. The photo absorption just above $T_c^*1$ and $T_c^*2$ are expectedly sharp, leading to sharp R (susceptibility) fluctuations as shown in FIG. 8.

The Meissner effect does not show these fluctuations because the IR source is localized on a portion of the tablet and the area outside this localized portion tends to be maintained in superconducting phase of the highest possible $T_c^*$ value, which is approximately 186K. The reason is that magnetic repulsion can be due to unconnected small regions which exist as long as IR of <hv<$E_0$, is applied.

Fourth Experiment

This was a Meissner experiment using the set up of experiment 2. The tablet was cooled to a temperature of $T_c$ or 93K until the tablet entered the superconducting state as signified by the swing of the magnet. The measured temperature of the tablet dropped as it entered this state. Once the superconducting state was reached and a sufficient population of excitons were present, the light source was turned on and the temperature was raised. The maximum Meissner effect was maintained up to a temperature of 186K.

Fifth Experiment

This was a resistance measurement experiment using the set up of Experiment 3 and the process of Experiment 4. The tablet was cooled to a temperature of $T_c$ or 93K until the tablet entered the superconducting state as signified by the resistance measurement. Once the superconducting state was reached and a sufficient population of excitons were present, the light source was turned on and the temperature was raised. The measured resistance showed a superconducting state was maintained up to a temperature of 186K.

Sixth Experiment

Figure 9:
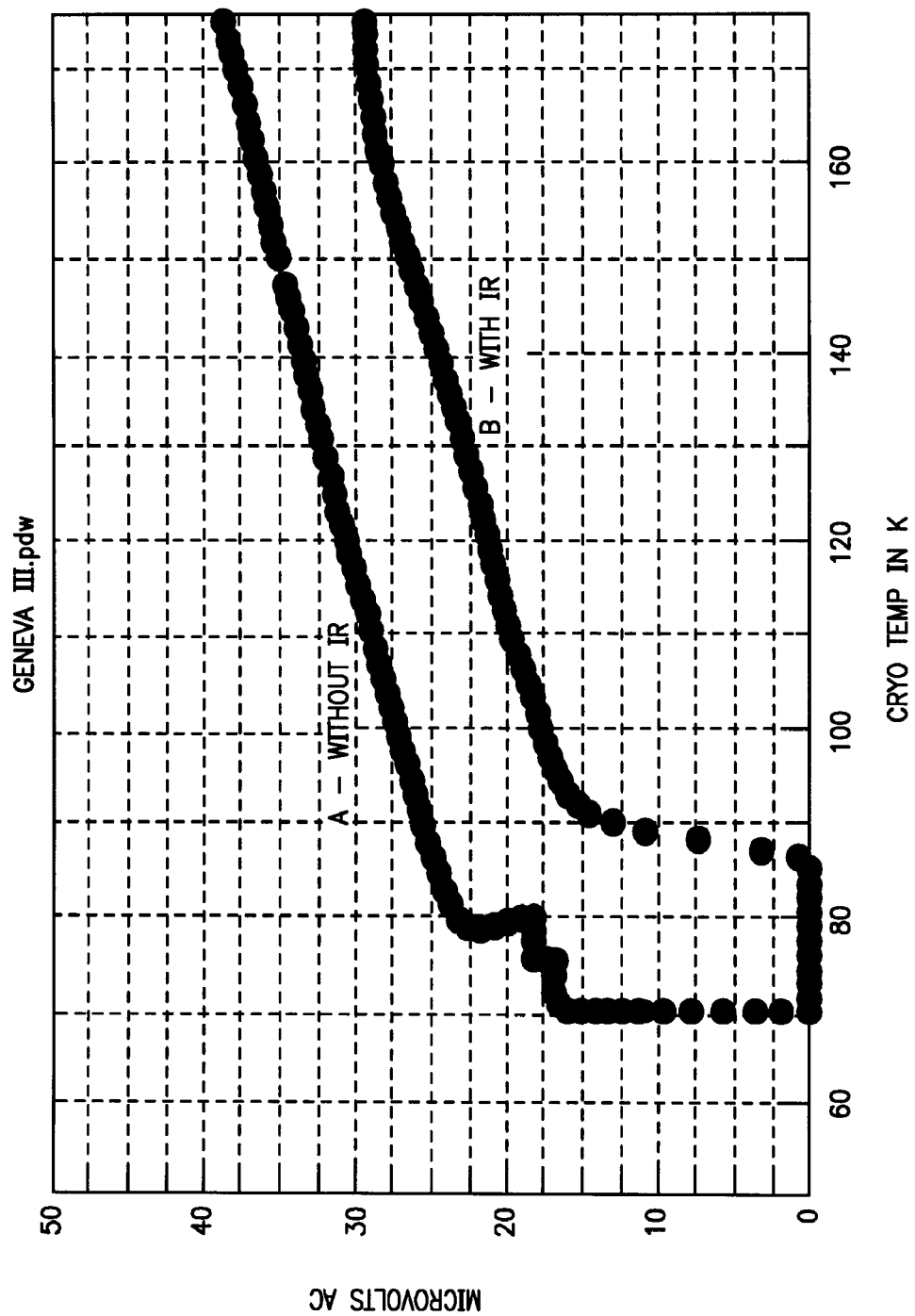
FIG. 9 is a graph of voltage versus temperature for oxygen deficient YBCO of the sixth experiment.

This was a resistance measurement experiment using an oxygen deficient YBCO thin film by measuring the transition temperature using AC voltage versus temperature measurement inside a closed Helium Janis cryogenic chamber. The YBCO was a Theva S type square of 8 mm×8 mm×3000 Angstroms. The measurements were made using a 100 Khz DSP lock-in-amplifier. The experiment was run twice, once with no light and once with the light applied as in Experiments 4 and 5. The transition temperature was shown to increase ~17K, from $T_c$=69.5K to $T_c^*$=86.5K. The results are shown in FIG. 9. The increase in $T_c$, although small, is shown to be exactly as the value calculated by the same EEM theory. As is well known, $T_c$ of this material is less than $T_c$ of YBCO because of the oxygen deficiency and the resulting decrease in the fraction of whole density n. Although $E_0$ for YBCO was lower, the minimum energy or 8/9 $E_0$ was 1333 nm which was in the range of 1300±50 nm of the light source used.

It is preferred that the light energy be applied after the superconductor has been in the superconducting state for a sufficient time to reach a large mass of excitons and before the temperature is raised above $T_c$. The light energy maintains the excitons stable up to $T_c^*$ and thus in the superconducting state. If the light energy is applied after the temperature is raised above $T_c$, there are less excitons to maintain stable and the temperature at which superconducting state ceases is lower. Although the occurrence of the superconducting states were shown in the third experiment where the light energy was applied will dropping the temperature towards $T_c$, these states where not maintained stable in the experiment.

Experiments with deoxygenated YBCO, wherein the oxygen has a coefficient less than the standard 7, show that critical current and the conductivity of Josephson junctions can be increase by illumination. See reference [8]. This included conductivity and superconductivity at an increase temperature, which is below the critical temperature $T_c$ since the $T_c$ of the deoxygenated YBCO is below that of the standard YBCO. It is postulated that this observation is due to photodoping of the oxygen depleted region in the weak link. The present system and experiments were performed on standard YBCO and showed a significantly great response to a specific range of applied energy and corresponding wave lengths.

Experiments will show that thallium-based high temperature superconductors will obey the same relationship and thus they are also tunable.

Light source 16 may be a common laser or light source having its wavelength varied by a filter 19. The superconductor 10 with light source 16 may be part of a circuit wherein 30 and 32 are detectors to detect the transition of the superconductor material into and out of superconductivity. There are well-known applications for such a device.

Although the present disclosure has been described and illustrated in detail, it is to be clearly understood that this is done by way of illustration and example only and is not to be taken by way of limitation. The scope of the present disclosure is to be limited only by the terms of the appended claims.

REFERENCES

[1] K. W. Wong and W. Y Ching, Physica C416 (2004) 47
[2] J. G. Bednorz, K. A. Müller, Z. Phys. B64 (1986) 188
[3] H. L. Ji and K. W. Wong, Phys. Lett. A256 (1999) 66
[4] Xin, K. W. Wong, C. X. Fan, Z. Z. Sheng and F. T. Chan, Phys. Rev. B45 (1993) 557
[5] W. Y. Ching, Yongnian Xu and K. W. Wong, Phys. Rev. B40 (1989) 7584
[6] R. L. Davidchack, K. W. Wong and P. C W. Fung, Phys. Lett. A223 (1996) 289
[7] R. F. Service, Science 310 (2005) 1271
[8] A. Gilabert, A. Hoffman, J. Elly, M. G. Mdeici, f. Schmidl, P. Seidel and I. K. Schuller, J of Low Temp Phys. vol. 106, Nos. 3/4 (1997)

What is claimed:

1. A method of operating a superconductor in its superconducting state at a temperature $T_c(i)$ in the range of $T_c^*$ to $T_c$, where $T_c^*$ is greater than the superconductivity temperature Te of the superconductor, the method comprising:
    initially cooling the superconductor to a temperature of $T_c$ or less;
    applying energy as incoherent light to the superconductor only after the superconductor has entered a superconducting state at $T_c$, the energy corresponding to the quantum energy hv less than $E_0$, where $E_0$ is the ground state of the two-dimensional excitation binding energy of the superconductor; and
    subsequently raising the temperature of the superconductor to the selected temperature $T_c(i)$ above $T_c$, while maintaining superconductivity to the temperature $T_c(i)$ in a range greater than the superconductivity temperature $T_c$ of the superconductor.

2. The method of claim 1, wherein the energy is applied as pulses.

3. The method of claim 1, wherein the superconductor is initially cooled at the temperature of $T_c$ or less until the temperature of the superconductor falls below the cooling temperature.

4. The method of claim 1, wherein the superconductor is initially cooled at the temperature of $T_c$ or less until a sufficient amount of stable global localized excitons are produced to sustain the superconducting state.

5. The method of claim 1, wherein the energy is applied before the cooling temperature is subsequently raised above $T_c$.

6. The method of claim 1, wherein the energy is applied after the cooling temperature is subsequently raised above $T_c$, and before loss of the superconducting state.

7. The method of claim 1, wherein $E_0$ is a function of the fraction of hole density n which varies with variations in the superconductor material.

8. A method of operating a superconductor in its superconducting state at a temperature $T_c(i)$ in the range of $T_c^*$ to $T_c$, where $T_c^*$ is greater than the superconductivity temperature Te of the superconductor, the method comprising:
    initially cooling the superconductor to a temperature of $T_c$ or less;
    applying energy as incoherent light to the superconductor only after the superconductor has entered a superconducting state at $T_c$, wherein the applied energy is 8/9 of $E_0$, where $E_0$ is the ground state of the two-dimensional excitation binding energy of the superconductor; and subsequently raising the temperature of the superconductor to the selected temperature $T_c(i)$ above $T_c$, while maintaining superconductivity to the temperature $T_c(i)$ in a range greater than the superconductivity temperature $T_c$ of the superconductor.

\* \* \* \* \*